United States Patent
Hu et al.

(10) Patent No.: US 12,532,570 B2
(45) Date of Patent: Jan. 20, 2026

(54) BACK CONTACT CELL AND SOLAR CELL MODULE

(71) Applicant: Trina Solar Co., Ltd, Changzhou (CN)

(72) Inventors: Yunyun Hu, Changzhou (CN); Wei Liu, Changzhou (CN); Daming Chen, Changzhou (CN); Guangtao Yang, Changzhou (CN)

(73) Assignee: Trina Solar Co., Ltd, Jiangsu (CN)

( * ) Notice: Subject to any disclaimer, the term of this patent is extended or adjusted under 35 U.S.C. 154(b) by 0 days.

(21) Appl. No.: 18/790,822

(22) Filed: Jul. 31, 2024

(65) Prior Publication Data

US 2025/0048778 A1 Feb. 6, 2025

(30) Foreign Application Priority Data

Aug. 2, 2023 (CN) .......................... 202310961338.2

(51) Int. Cl.
*H10F 77/20* (2025.01)
*H10F 10/14* (2025.01)
(Continued)

(52) U.S. Cl.
CPC ......... *H10F 77/219* (2025.01); *H10F 10/146* (2025.01); *H10F 19/908* (2025.01); *H10F 77/122* (2025.01); *H10F 77/311* (2025.01)

(58) Field of Classification Search
CPC ......... H01L 31/022441; H01L 31/0516; H01L 31/02167; H01L 31/02168; H10F 10/146; H10F 19/908; H10F 77/219
See application file for complete search history.

(56) References Cited

U.S. PATENT DOCUMENTS

| 2017/0179325 A1* | 6/2017 | Chung .............. H01L 31/02167 |
| 2022/0393052 A1* | 12/2022 | Qiu .................. H01L 31/035281 |
| 2023/0238463 A1 | 7/2023 | Wu et al. |

FOREIGN PATENT DOCUMENTS

| CN | 115588698 | 1/2023 |
| CN | 115832065 | 3/2023 |

(Continued)

OTHER PUBLICATIONS

Office Action dated Sep. 2, 2024 in corresponding Australian Patent Application No. 2024205235, 7 pages.
(Continued)

*Primary Examiner* — Lindsey A Buck
(74) *Attorney, Agent, or Firm* — HOVEY WILLIAMS LLP

(57) ABSTRACT

This disclosure provides back contact cell and solar cell module. The back contact cell comprises a semiconductor substrate, the semiconductor substrate is provided with a front surface and a back surface opposite to each other, the back surface includes a plurality of adjacent and alternately arranged segment units, a segment space is formed between segment unit and the backlight surface; the segment space further includes a first space, a second space, a third space and a fourth space; a first passivation layer, located only in the first space in each segment space; a first doped semiconductor layer, located only in the first space in each segment space, and being adjacent to a side of the first passivation layer away from the semiconductor substrate; a second passivation layer, located only in the second space~the fourth space in each segment space; and a second doped semiconductor layer located only in the second space~the fourth space in each segment space, and being adjacent to a side of the second passivation layer away from the semiconductor substrate.

15 Claims, 2 Drawing Sheets

(51) Int. Cl.
    *H10F 19/90*     (2025.01)
    *H10F 77/122*     (2025.01)
    *H10F 77/30*     (2025.01)

(56) References Cited

FOREIGN PATENT DOCUMENTS

| | | |
|---|---|---|
| CN | 116230783 | 6/2023 |
| CN | 116314415 A | 6/2023 |
| JP | 2013125964 | 6/2013 |
| JP | 2014096574 | 5/2014 |
| WO | 2012132729 A1 | 10/2012 |
| WO | 2015/189878 | 12/2015 |
| WO | WO-2022073627 A1 * | 4/2022 ....... H01L 31/02167 |

OTHER PUBLICATIONS

Machine Translation of WO2015/189878, 11 pages.
Machine Translation of CN116230783, 12 pages.
Machine Translation CN115588698, 15 pages.
Pre-Examination Notice (with English translation) dated Jul. 27, 2023, 4 pages.
Machine Translation of CN115832065, 17 pages.
Office Action in corresponding Japanese Patent Application 2024-040228 dated Jan. 7, 2025, 3 pages.
Machine Translation of Office Action in corresponding Japanese Patent Application 2024-040228 dated Jan. 7, 2025, 3 pages.
Office Action dated Mar. 7, 2025 in corresponding European Patent Application No. 24192551.0, 8 pages.
Machine Translation of JP2013125964, 11 pages.
Machine Translation of JP2014096574, 10 pages.
Machine Translation of WO2012132729, 10 pages.
Machine Translation of CN116314415, 8 pages.

\* cited by examiner

BACK CONTACT CELL AND SOLAR CELL MODULE

CROSS-REFERENCE TO RELATED APPLICATION

The present non-provisional patent application claims priority benefit to Chinese Patent Application No. CN202310961338.2, filed Aug. 2, 2023, and titled "Back Contact Cell and Solar Cell Module," the entirety of which is hereby incorporated by reference into the present non-provisional patent application.

TECHNICAL FIELD

The present disclosure mainly relates to the technical fields of photovoltaic technology, and in particular to a back contact cell and solar cell module.

BACKGROUND

As PERC (Passivated emitter and rear contact) cell technology matures and continues to tap its potential, it is gradually approaching the theoretical limit of its conversion efficiency, and the industry has begun to seek next-generation technologies, the mainstream technologies currently being promoted of which include TOPCon, HJT and IBC, etc.

Different from traditional double-sided electrode contact cell, the biggest feature of back contact cell is that the metal electrode is located on the back surface of the cell, and the front surface is not blocked by the metal electrode, which improves the utilization of light and therefore has higher short-circuit current and conversion efficiency. However, the passivation performance and open circuit voltage of back contact cells are generally poor, and the photoelectric conversion efficiency is not high. Therefore, how to further improve the performance of back contact cell is an urgent technical problem to be solved in this field.

SUMMARY

The technical problem to be solved by the present disclosure is to provide a back contact cell and solar cell module, which can increase the open circuit voltage and improve the efficiency and reliability of the cell.

In order to solve the above technical problems, the present disclosure provides a back contact cell, comprising: a semiconductor substrate, the semiconductor substrate is provided with a front surface and a back surface opposite to each other, the front surface being close to a light-receiving surface of the back contact cell, and the back surface being close to a backlight surface of the back contact cell, the back surface includes a plurality of adjacent and alternately arranged segment units, wherein each segment unit includes a first segment, a second segment, a third segment and a fourth segment arranged adjacent and alternately, a first space, a second space, a third space and a fourth space are respectively formed between the first segment to the fourth segment and the back surface, and the first space to the fourth space together form a segment space between each segment unit and the backlight surface; a first passivation layer, located only in the first space in each segment space; a first doped semiconductor layer, located only in the first space in each segment space, and being adjacent to a side of the first passivation layer away from the semiconductor substrate; a second passivation layer, located only in the second space, the third space and the fourth space in each segment space; and a second doped semiconductor layer located only in the second space, the third space and the fourth space in each segment space, and being adjacent to a side of the second passivation layer away from the semiconductor substrate.

In one embodiment of the present disclosure, the semiconductor substrate further includes a substrate doped layer adjacent to each first segment, the substrate doped layer having the same conductivity type as the semiconductor substrate.

In one embodiment of the present disclosure, the back contact cell further comprises an insulating layer located in the first space, the second space and the fourth space in each segment space, located on a side of the first doped semiconductor layer away from the semiconductor substrate in the first space, and adjacently located to the backlight surface of the semiconductor substrate in the second space and the fourth space.

In one embodiment of the present disclosure, the back contact cell further comprises a doped oxide layer located in the first space in each segment space, and adjacently located between the side of the first doped semiconductor layer away from the semiconductor substrate and the insulating layer.

In one embodiment of the present disclosure, the back contact cell further comprises a conductive layer located in the first space, the second space, the third space and the fourth space in each segment space, wherein, in the first space, at least part of the conductive layer is adjacent to a side of the insulating layer away from the semiconductor substrate, and at least another part of the conductive layer is adjacent to the side of the first doped semiconductor layer away from the semiconductor substrate; in the second space to the fourth space, at least part of the conductive layer is adjacent to a side of the second doped semiconductor layer away from the semiconductor substrate.

In one embodiment of the present disclosure, the back contact cell further comprises a first electrode and a second electrode, respectively located respectively in the first space and the third space in each segment space, and the first electrode is located in the first space adjacent to a side of the conductive layer away from the semiconductor substrate, the second electrode is located in the third space adjacent to a side of the conductive layer away from the semiconductor substrate.

In one embodiment of the present disclosure, the conductive layer forms a contact groove concave toward the semiconductor substrate in the first space in each segment space, the first electrode contacts the conductive layer in the contact groove, and the contact groove contacts the conductive layer on a surface close to side of the semiconductor substrate, or extends into an interior of the first doped semiconductor layer.

In one embodiment of the present disclosure, from the first segment, the second segment, the third segment and the fourth segment to the front surface of the semiconductor substrate, there is a first distance $L1$, a second distance $L2$, a third distance $L3$ and a fourth distance $L4$ respectively, wherein, $L3$ is less than or equal to $L2$; $L3$ is less than or equal to $L4$; $L2$ is less than or equal to $L1$; and $L4$ is less than or equal to $L1$.

In one embodiment of the present disclosure, cell structure in the second space corresponding to the second segment and the fourth space corresponding to the fourth segment are the same, and $L2$ is equal to $L4$.

In one embodiment of the present disclosure, the back contact cell further comprises a front-side passivation layer located between the front surface of the semiconductor substrate and the light-receiving surface and adjacent to the front surface, wherein the front-side passivation layer includes intrinsic amorphous silicon, aluminum oxide, nitrogen silicone, silicon oxynitride and/or silicon oxide.

In one embodiment of the present disclosure, the back contact cell further comprises a front-side anti-reflection layer adjacently located to a side of the front-side passivation layer away from the semiconductor substrate, wherein the front-side anti-reflection layer includes nitrogen silicone, silicon oxynitride, silicon oxide and/or transparent conductive layer.

In one embodiment of the present disclosure, the front surface of the semiconductor substrate has a textured structure, and the textured structure includes a pyramid textured surface and/or an etched pit textured surface.

In one embodiment of the present disclosure, the back surface of the semiconductor substrate includes the textured structure and/or a polished surface structure, wherein the third segment is the textured surface structure or the polished surface structure, and the first segment, the second segment and the fourth segment are the polished surface structure.

In one embodiment of the present disclosure, the first passivation layer includes a tunnel oxide layer, the first doped semiconductor layer includes doped polysilicon, and the first doped semiconductor layer has the same doped type as the semiconductor substrate.

In one embodiment of the present disclosure, the second passivation layer includes intrinsic amorphous silicon, the second doped semiconductor layer includes doped amorphous silicon and/or microcrystalline silicon, and the second doped semiconductor layer is of an opposite doped type to the semiconductor substrate.

In one embodiment of the present disclosure, the back contact cell further comprises at least one isolation groove located in each segment space, the isolation groove being located only in the first space or simultaneously located in the second space and the fourth space.

In one embodiment of the present disclosure, the back contact cell further comprises two isolation grooves located in the second space and the fourth space in each segment space, and the two isolation grooves penetrate at most to an interior of the insulating layer in a direction gradually approaching the semiconductor substrate.

In one embodiment of the present disclosure, the back contact cell further comprises two isolation grooves located in the first space in each segment space, and the two isolation grooves are respectively located on both sides of the contact groove, the two isolation grooves penetrate at most to an interior of the insulating layer in a direction gradually approaching the semiconductor substrate.

Another aspect of the present disclosure also provides a solar cell module comprising a plurality of above-mentioned back contact cell connected in series and/or in parallel.

Compared with the existing technology, this disclosure has the following advantages: the back contact cell of this disclosure is designed with an alternately arranged segment unit structure on the back of the battery, arranging different cell feature layers in different sections and spatial locations within each segment unit, and further expanding the design of different contact grooves and different isolation grooves positions, which can effectively increase the open circuit voltage of the battery and ensure the battery has higher conversion efficiency and reliability.

BRIEF DESCRIPTION OF THE DRAWINGS

The drawings are included to provide a further understanding of the present disclosure, and they are included and constitute a part of the present disclosure, the drawings show the embodiments of the present disclosure, and serving to explain the principles of the present disclosure together with the description. In the drawings.

Figure 1:
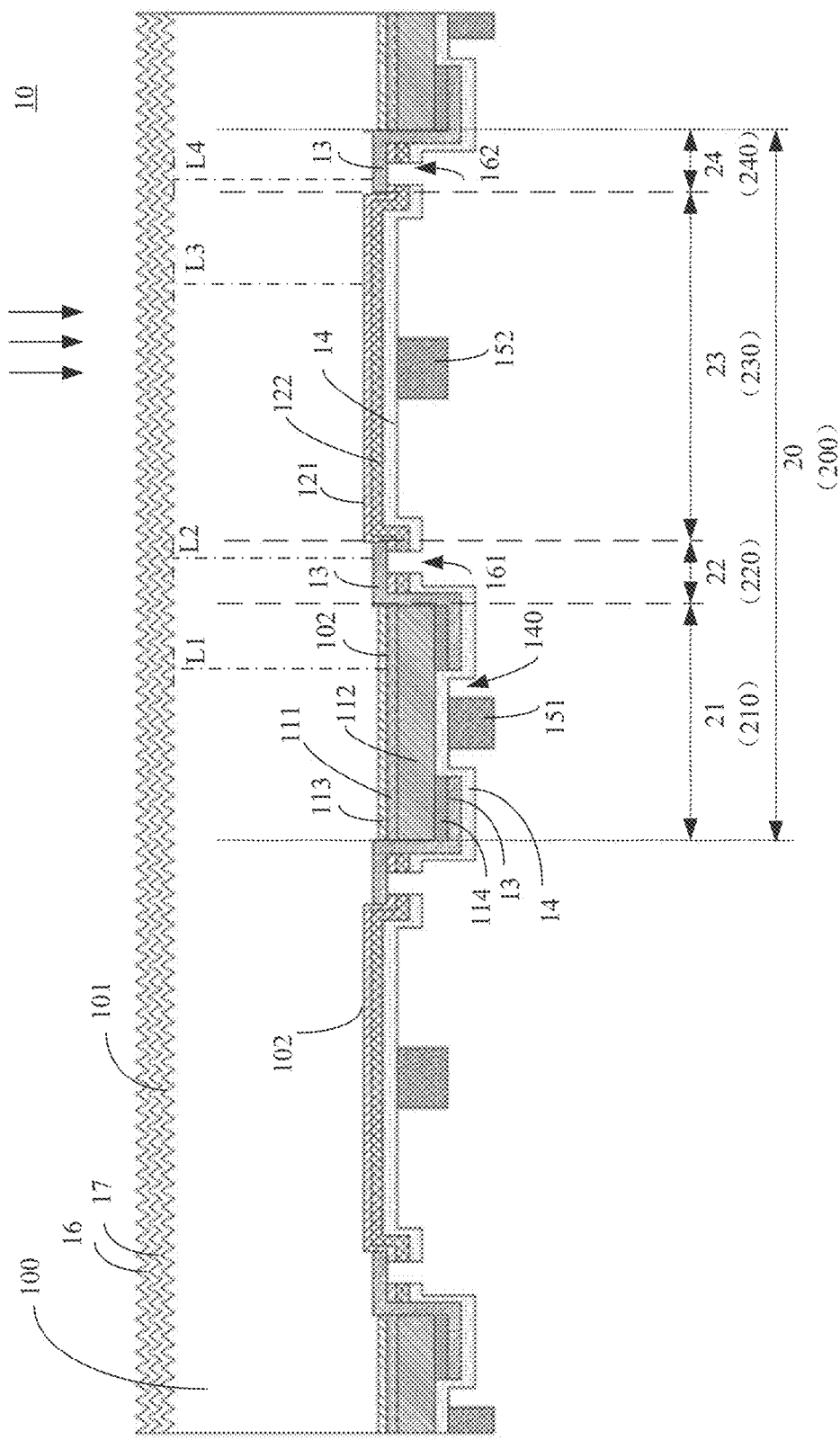
FIG. 1 is a schematic structural view of a back contact cell according to an embodiment of the present disclosure.

LIST OF SIGNS IN DRAWINGS back contact cell 10/10', semiconductor substrate 100, front surface 101, back surface 102, front-side passivation layer 16, front-side anti-reflection layer 17, first passivation layer 111, first doped semiconductor layer 112, substrate doped layer 113, doped oxide layer 114, second passivation layer 121, second doped semiconductor layer 122, insulating layer 13, conductive layer 14, contact groove 140, first electrode 151, second electrode 152, first isolation groove 161, second isolation groove 162, third isolation groove 161', fourth isolation groove 162', segment unit 20, segment space 200, first segment 21, second segment 22, third segment 23, fourth segment 24, first space 210, second space 220, third space 230, fourth space 240.

PREFERRED EMBODIMENT OF THE PRESENT DISCLOSURE

In order to illustrate the technical solutions in the embodiments of the present disclosure more clearly, the drawings that need to be used in the description of the embodiments will be briefly introduced below. Obviously, the drawings in the following description are only some embodiments of the present disclosure, and for those skilled in the art, other drawings can also be obtained based on these drawings without creative effort.

As indicated in this disclosure and claims, the terms "a", "an", "a kind of" and/or "the" do not specifically refer to the singular and may include the plural unless the context clearly indicates an exception. Generally speaking, the terms "comprising" and "including" only suggest the inclusion of clearly identified steps and elements, and these steps and elements do not constitute an exclusive list, and the method or device may also contain other steps or elements.

The relative arrangements of components and steps, numerical expressions and numerical values set forth in these embodiments do not limit the scope of the present disclosure unless specifically stated otherwise. At the same time, it should be understood that, for the convenience of description, the sizes of the various parts shown in the drawings are not drawn according to the actual proportional relationship. Techniques, methods and devices known to those of ordinary skill in the relevant art may not be discussed in detail, but where appropriate, such techniques, methods and devices should be considered part of the authorized specification. In all embodiments shown and discussed herein, any specific values should be construed as illustrative only, and not as limiting. Therefore, other examples of the exemplary embodiment may have different values. It should be noted that like numerals and letters denote like items in the following figures, therefore, once an item is defined in one figure, it does not require further discussion in subsequent drawings.

In the description of the present disclosure, it should be understood that orientation words such as "front, back, up, down, left, right", "landscape, portrait, vertical, horizontal" and "top, bottom" etc. indicating the orientation or positional relationship is generally based on the orientation or positional relationship shown in the drawings, only for the convenience of describing the disclosure and simplifying the description, in the absence of a contrary statement, these orientation words do not indicate or imply that the device or element referred to must have a specific orientation or be constructed and operated in a specific orientation, and therefore cannot be construed as limiting the scope of protection of this disclosure; the orientation words "inside and outside" refer to inside and outside relative to the outline of each part itself.

For the convenience of description, spatially relative terms may be used here, such as "on . . . ", "over . . . ", "on the upper surface of . . . ", "above", etc., to describe the spatial positional relationship between one device or feature and other devices or features. It will be understood that, in addition to the orientation depicted in the drawings, the spatially relative terms are intended to encompass different orientations of the device in use or operation. For example, if the device in the drawings is turned over, devices described as "on other devices or configurations" or "above other devices or configurations" would then be oriented "beneath other devices or configurations" or "under other devices or configurations". Thus, the exemplary term "above" can encompass both an orientation of "above" and "beneath". The device may be otherwise oriented (rotated 90 degrees or at other orientations), and making a corresponding explanation for the space relative description used here.

In addition, it should be noted that the use of words such as "first" and "second" to define components is only for the convenience of distinguishing corresponding components, unless otherwise stated, the above words have no special meanings, and therefore cannot be construed as limiting the protection scope of the present disclosure. In addition, although the terms used in this disclosure are selected from well-known and commonly used terms, some terms mentioned in the specification of this disclosure may be selected by the applicant according to his or her judgment, and their detailed meanings are listed in this article described in the relevant segment of the description. Furthermore, it is required that this disclosure be understood not only by the actual terms used, but also by the meaning implied by each term.

An embodiment of the present disclosure proposes a back contact cell 10 with reference to FIG. 1, which can increase the open circuit voltage of the cell and improve the efficiency and reliability of the cell.

Referring to FIG. 1, the back contact cell 10 mainly comprises a semiconductor substrate 100, a first passivation layer 111, a first doped semiconductor layer 112, a second passivation layer 121 and a second doped semiconductor layer 122. Specifically, the semiconductor substrate 100 is provided with a front surface 101 and a back surface 102 opposite to each other, the front surface 101 being close to a light-receiving surface (that is, the outermost surface of the back contact cell 10 facing the light source as a whole) of the back contact cell, and the back surface 102 being close to a backlight surface (that is, the outermost surface of the back contact cell 10 facing away from the light source as a whole) of the back contact cell 10. Referring to FIG. 1, it can be seen that the back surface 102 includes a plurality of adjacent and alternately arranged segment units 20. Referring again to FIG. 1, each segment unit 20 includes a first segment 21, a second segment 22, a third segment 23 and a fourth segment 24 arranged adjacent and alternately, and a first space 210, a second space 220, a third space 230 and a fourth space 240 are respectively formed between the first segment 210 to the fourth segment 240 and the back surface 102, and the first space 210 to the fourth space 240 together form a segment space 20 between each segment unit 200 and the backlight surface.

It should be explained that in this disclosure, the back surface 102 is divided into a plurality of segment units 20 and further refined into a first to fourth segment 21~24 as well as the first to fourth space 210~240 formed in the space, and these all is artificial defining for convenient to describe the positions of each feature layer based on the back surface 102, especially the positions of the first isolation groove 161 and the second isolation groove 162 (will be further explained below). These divisions of segments and spaces are not inherent properties of the back contact cell 10. In addition, since the conclusions of these divisions are not based on cell attributes but are artificial divisions, FIG. 1 only schematically shows the morphological characteristics of the interface between adjacent segments (such as a right angle, etc.). In actual production, These interfaces will also change according to the actual deposition and etching conditions of each feature layer, therefore, those skilled in the art can understand that the interface of each segment should not be unreasonably restricted based on what is shown in FIG. 1.

Furthermore, according to FIG. 1, the first passivation layer 111 is located only in the first space 210 in each segment space 200. The first doped semiconductor layer 112 is located only in the first space 210 in each segment space 200, being adjacent to a side of the first passivation layer 111 away from the semiconductor substrate 100. On this basis, the second passivation layer 121 is located only in the second space 220, the third space 230 and the fourth space 240 in each segment space 200. The second doped semiconductor layer 122 is located only in the second space 220, the third space 230 and the fourth space 240 in each segment space 200, being adjacent to a side of the second passivation layer 121 away from the semiconductor substrate 100.

Based on this design concept, the actual implementation of the first passivation layer 111 includes a tunnel oxide layer, the first doped semiconductor layer 112 includes doped polysilicon, and the first doped semiconductor layer 112 has the same doped type as the semiconductor substrate 100. On the other hand, in this embodiment, the second passivation layer 122 includes intrinsic amorphous silicon, and correspondingly, the second doped semiconductor layer 122 includes doped amorphous silicon and/or microcrystalline silicon, and the second doped semiconductor layer 122 is of an opposite doped type to the semiconductor substrate 100. Therefore, based on the isolation and transition of the second segment 22 and its corresponding second space 220, the cell passivation performance is improved on one side of the second space 220 (the first space 210), while it increases the open circuit voltage of the cell on another side of the second space 220 (the third space), thereby improving the performance and stability of the back contact cell 10.

Preferably, in this embodiment, the semiconductor substrate 100 further includes a substrate doping layer 113 of the same material and conductivity type as the semiconductor substrate 100 at a position adjacent to each first segment 21. It can be clearly seen from FIG. 1 that the substrate doped layer 113 is located on the side of the back surface 102 close to the semiconductor substrate 100, so the lower surface of the substrate doped layer 113 is also the first segment 21 on the back surface 102. By providing the substrate doped layer 113, a back electric field can be formed within the semiconductor substrate 100. For example, when preparing the first doped semiconductor layer 112, especially when doping it, the doping source will be pushed into the semiconductor substrate 100, thereby forming the substrate doped layer 113.

Furthermore, the back contact cell 10 of this embodiment further includes a doped oxide layer 114 located in the first space 210 in each segment space 200, being adjacent to the side of the first doped semiconductor layer 112 away from the semiconductor substrate 100. For example, the doped oxide layer 114 and the first doped semiconductor layer 112 have the same doped material, and the doped oxide layer 114 may be doped silicon oxide. It should be noted that in some other embodiments of the present disclosure, the doped oxide layer 114 may not be provided. Specifically, during cell preparation, especially when doping the first doped semiconductor layer 112, the doped oxide layer 114 can be directly formed, therefore this layer can be removed through additional steps in some embodiments. In contrast, this embodiment retains the doped oxide layer 114, which can simplify the process flow and reduce production costs.

On this basis, the back contact cell 10 further includes an insulating layer 13 located in the first space 210, the second space 220 and the fourth space 240 in each segment space 200, the insulating layer 13 in the first space 210 is adjacent to the side of the doped oxide layer 114 away from the semiconductor substrate 100, and the insulating layer 13 in the second space 220 and the fourth space 240 is adjacent to the back surface of the semiconductor substrate. For example, the insulating layer 13 may be composed of one or more compounds such as silicon nitride, silicon oxynitride, and silicon oxide. In this embodiment, the insulating layer 13 is provided to better prevent areas of different polarities on the back surface 102 from electrically connected and cause short circuits.

Based on the above structure, the back contact cell 10 further includes a conductive layer 14 located in the first space 210, the second space 220, the third space 230 and the fourth space 240 in each segment space 200. Specifically referring to FIG. 1, in the first space 210, at least part of the conductive layer 14 is adjacent to a side of the insulating layer 13 away from the semiconductor substrate 100, and at least another part of the conductive layer 14 is adjacent to a side of the first doped semiconductor layer 112 away from the semiconductor substrate 100. In the second space 220~the fourth space 240, at least part of the conductive layer 14 is adjacent to a side of the second doped semiconductor layer 122 away from the semiconductor substrate 100.

On this basis, in this embodiment, the back contact cell 10 further includes a first electrode 151 and a second electrode 152, respectively located in the first space 210 and the third space 230 in each segment space 200, and the first electrode 151 is located in the first space 210 adjacent to a side of the conductive layer 14 away from the semiconductor substrate 100, the second electrode 152 is located in the third space 230 adjacent to a side of the conductive layer 14 away from the semiconductor substrate 100.

Further preferably, the conductive layer 14 forms a contact groove 140 concave toward the semiconductor substrate 100 in the first space 210 in each segment space 200, the first electrode 151 contacts the conductive layer 14 in the contact groove 140, and the contact groove 140 contacts the conductive layer 14 on a surface close to side of the semiconductor substrate 100. However, the present disclosure is not limited to the example shown in FIG. 1, and in some other embodiments of the present disclosure, the contact groove may extend into an interior of the first doped semiconductor layer 112. It can be understood that when preparing the back contact cell 10, the cell preparation can be completed on the back surface 102 by a combination of etching and deposition. In order to form the contact groove 140, for example, the prepared doped oxide layer 114 and the insulating layer 13 in the first space 210 can be partially etched before depositing the conductive layer 14 to form the shape of the contact groove 140, and the partially etching methods include laser ablation combined with wet etching, printing corrosive ink combined with wet etching, etc. Therefore, during the process of continuing to deposit the conductive layer 14, the conductive layer 14 will form a groove-like topography in the etched area, thereby generating the contact groove 140.

Furthermore, it can be seen from FIG. 1 that the back surface 102 has undulating features in topography. Specifically, from the first segment 21, the second segment 22, the third segment 23 and the fourth segment 24 to the front surface 101 of the semiconductor substrate 100, defining a first distance L1, a second distance L2, a third distance L3 and a fourth distance L4 respectively. For example, since the front surface 101 has a textured structure, the lower edge of the textured structure is selected as a baseline to define the above distances; however, the disclosure is not limited to this, in other embodiments of the disclosure, depending on the topography of the front surface 101, there may be other ways to determine the baseline, while as long as the above-mentioned first to fourth segments 21 to 24 adopt the same baseline determination method, the relative size relationship between the distances L1 to L4 from the first segment 21, the second segment 22, the third segment 23 and the fourth segment 24 to the front surface 101 of the semiconductor substrate 100 described in this disclosure will not change accordingly.

Specifically, in multiple embodiments of the present disclosure, L3 is less than or equal to L2, L3 is less than or equal to L4, L2 is less than or equal to L1, and L4 is less than or equal to L1. Preferably, in some embodiments of the present disclosure, cell structure in the second space 220 corresponding to the second segment 22 and the fourth space 240 corresponding to the fourth segment 24 are the same, and L2 is equal to L4. Therefore, in such embodiments, the second space 220 and the fourth space 240 may be collectively understood as isolation or transition regions of the back contact cell 10. Specifically, the second space 220 can be understood as an isolation or transition area for each adjacent two characteristic areas of the first space 210 and the third space 230 in each segment space 200, while the fourth space 240 can be understood as isolation or transition area for each two adjacent segment spaces 200: the isolation or transition area between the third space 230 characteristic area in the former segment space 200 and the first space 210 characteristic area in the latter segment space 200.

In different embodiments proposed in this disclosure, the back contact cell further includes at least one isolation groove located in each segment space, the isolation groove being located only in the first space or simultaneously located in the second space and the fourth space. The following is a further detailed description with reference to the drawings.

By way of example, FIG. 1 shows a situation where the isolation groove is located in the second space 220 and the fourth space 240 at the same time. In this embodiment, the number of isolation grooves is two, which are the first isolation groove 161 and the second isolation groove 162 respectively. Referring to FIG. 1, it can be seen that the first isolation groove 161 is located in the second space 220, and the second isolation groove 162 is located in the fourth space 240. Further, the first isolation groove 161 and the second isolation groove 162 sequentially penetrate the conductive layer 14, the second doped semiconductor layer 122 and the second passivation layer 121 in the direction gradually approaching the semiconductor substrate 100 and finally reach the lower edge of the insulating layer 13. However, the present disclosure is not limited to this. For example, based on further modifications in FIG. 1, the first isolation groove 161 can continue to extend upward to the interior of the insulating layer 131 but does not penetrate the insulating layer 131. In this embodiment, the first isolation groove 161 and the second isolation groove 162 are respectively provided in the second space 220 and the fourth space 240 without the first electrode 151 and the second electrode 152, which can achieve more perfect isolation between the two polarity areas in the segment space 200 corresponding to each segment unit 20.

Figure 2:
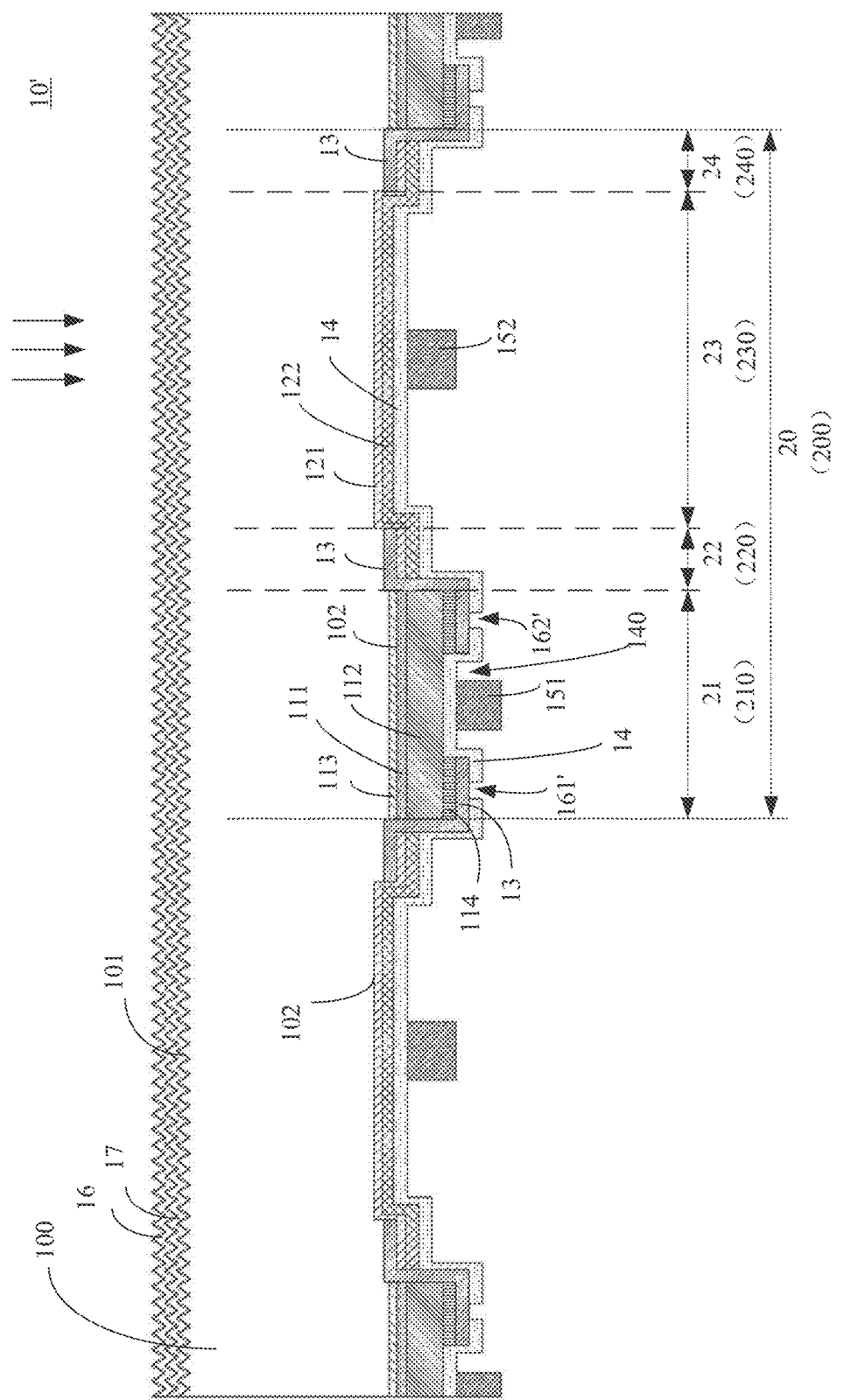
FIG. 2 is a schematic structural view of a back contact cell according to another embodiment of the present disclosure.

On the other hand, FIG. 2 shows another embodiment with different locations of the isolation grooves. Compared with the back contact cell 10 shown in FIG. 1, the back contact cell 10' shown in FIG. 2 only differs in the positions of two isolation grooves (the third isolation groove 161' and the fourth isolation groove 162'), therefore, other identical parts bear the same reference numerals. In the embodiment shown in FIG. 2, two isolation grooves are located in the first space 210 in each segment space 200. According to FIG. 2, it can be seen that the third isolation groove 161' and the fourth isolation groove 162' are respectively located on the left and right sides of the contact groove 140, and the two isolation grooves penetrate into the interior of the insulating layer in a direction gradually approaching the semiconductor substrate. It can be seen that, unlike the embodiment shown in FIG. 1, in this embodiment, the position of the isolation groove is set according to the position of the contact groove 140, which can better adapt to some preparation process scenarios.

The backside structure of the back contact cell 10 has been introduced above, and the front structure of the back contact cell 10 will be introduced below. On the front structure 101, the back contact cell 10 further includes a front-side passivation layer 16 located between the front surface 101 of the semiconductor substrate 100 and the light-receiving surface being adjacent to the front surface 101, wherein the front-side passivation layer 16 includes intrinsic amorphous silicon, aluminum oxide, nitrogen silicone, silicon oxynitride and/or silicon oxide.

On this basis, according to FIG. 1, the back contact cell 10 further includes a front-side anti-reflection layer 17 on the front-side passivation layer 16, adjacently located to a side of the front-side passivation layer 16 away from the semiconductor substrate 100, wherein the front-side anti-reflection layer 17 includes one of more of nitrogen silicone, silicon oxynitride, silicon oxide and/or transparent conductive layer.

On the other hand, the front surface 101 of the semiconductor substrate 100 has a textured structure, and the textured structure can be a pyramid textured surface, an etched pit textured surface, or a combination of the two. In this way, it can better reduce the reflection loss of incident light and increase light absorption. Correspondingly, the back surface 102 of the semiconductor substrate 100 adopts a textured surface structure, a polished surface structure, or a combination of the two. Preferably, referring to the embodiment shown in FIG. 1, on the back surface 102, the third segment 23 has a textured structure or a polished surface structure, and the first segment 21, the second segment 22 and the fourth segment 24 have a polished surface structure, and this design method can improve the passivation effect and simplify the process technology.

This disclosure is based on the manufacturing technology of back contact cells, taking into account the cell performance improvement effect and process costs, etc., wherein a plurality of adjacent and alternately arranged first to fourth spaces are designed on the backlight side of the solar cell. There are identical or different cell structures in each space. Wherein, the performance of the cell is mainly reflected by the characteristic layers in the first space and the third space, the first space is provided with a stacked structure of a first passivation layer (for example, a tunnel oxide layer) and a doped semiconductor layer (for example, a doped semiconductor layer), which has good passivation contact characteristics, reducing the carrier recombination rate in the metal electrode contact area, thereby increasing the open circuit voltage of the cell. Further, the third space is provided with a stacked structure of a second passivation layer (for example, intrinsic amorphous silicon) and a second doped semiconductor layer (for example, doped amorphous silicon/microcrystalline silicon, etc.), using its low surface recombination rate and other characteristics to further increase the open circuit voltage of the cell. On this basis, there is also a second space and a fourth space with the same or different cell structures, and the function of these two spaces is to isolate the first space and the third space with opposite polarities to avoid short circuit or leakage, ensuring higher conversion efficiency and reliability of the cell. In addition, after further considering factors such as process feasibility and process simplification, this disclosure also proposes the specific location characteristics of other characteristic layers (such as insulating layers, conductive layers, etc.) and isolation grooves, in this way, while ensuring the improvement of cell performance, the reliability of the cell can be further guaranteed under the premise that the process scope is allowed and controllable.

The present disclosure also proposes a solar cell module, including a plurality of back contact cells connected in series and/or in parallel as proposed in any embodiment of the present disclosure. Other details about the solar cell module are not the focus of this disclosure and will not be elaborated here.

The basic concepts have been described above, obviously, for those skilled in the art, the above disclosure of the disclosure is only an example, and does not constitute a limitation to the present disclosure. Although not expressly stated here, various modifications, improvements and amendments to this disclosure may be made by those skilled in the art. Such modifications, improvements, and amendments are suggested in this disclosure, so such modifications, improvements, and amendments still belong to the spirit and scope of the exemplary embodiments of this disclosure.

Meanwhile, the present disclosure uses specific words to describe the embodiments of the present disclosure. For example, "one embodiment", "an embodiment", and/or "some embodiments" refer to a certain feature, structure or characteristic related to at least one embodiment of the present disclosure. Therefore, it should be emphasized and noted that two or more references to "one embodiment" or "an embodiment" or "an alternative embodiment" in different places in this specification do not necessarily refer to the same embodiment. In addition, certain features, structures or characteristics of one or more embodiments of the present disclosure may be properly combined.

In the same way, it should be noted that in order to simplify the expression disclosed in the present disclosure and help the understanding of one or more embodiments of the disclosure, in the foregoing description of the embodiments of the present disclosure, sometimes multiple features are combined into one embodiment, drawings or descriptions thereof. However, this method of disclosure does not imply that the subject matter of the disclosure requires more features than are recited in the claims. Indeed, embodiment features are less than all features of a single foregoing disclosed embodiment.

In some embodiments, numbers describing the quantity of components and attributes are used, it should be understood that such numbers used in the description of the embodiments use the modifiers "about", "approximately" or "substantially" in some examples. Unless otherwise stated, "about", "approximately" or "substantially" indicates that the stated figure allows for a variation of ±20%. Accordingly, in some embodiments, the numerical parameters used in the specification and claims are approximations that can vary depending upon the desired characteristics of individual embodiments. In some embodiments, numerical parameters should take into account the specified significant digits and adopt the general digit reservation method. Although the numerical ranges and parameters used in some embodiments of the present disclosure to confirm the breadth of the scope are approximate values, in specific embodiments, such numerical values are set as precisely as practicable.

Although the present disclosure has been described with reference to the current specific embodiments, those of ordinary skill in the art should recognize that the above embodiments are only used to illustrate the present disclosure, and various equivalent changes or substitutions can also be made without departing from the spirit of the present disclosure, therefore, as long as the changes and modifications to the above-mentioned embodiments are within the spirit of the present disclosure, they will all fall within the scope of the claims of the present disclosure.

The invention claimed is:

1. A back contact cell, comprising:
a semiconductor substrate, the semiconductor substrate is provided with a front surface and a back surface opposite to each other, the front surface being close to a light-receiving surface of the back contact cell, and the back surface being close to a backlight surface of the back contact cell, the back surface includes a plurality of adjacent and alternately arranged segment units, wherein each segment unit includes a first segment, a second segment, a third segment and a fourth segment arranged adjacent and alternately, a first space, a second space, a third space and a fourth space are respectively formed between the first segment to the fourth segment and the back surface, and the first space to the fourth space together form a segment space between each segment unit and the backlight surface;
a first passivation layer, located only in the first space in each segment space;
a first doped semiconductor layer, located only in the first space in each segment space, and being adjacent to a side of the first passivation layer away from the semiconductor substrate;
a second passivation layer, located only in the second space, the third space and the fourth space in each segment space;
a second doped semiconductor layer located only in the second space, the third space and the fourth space in each segment space, and being adjacent to a side of the second passivation layer away from the semiconductor substrate; and
an insulating layer located in the first space, the second space and the fourth space in each segment space, located on a side of the first doped semiconductor layer away from the semiconductor substrate in the first space, and adjacently located to the backlight surface of the semiconductor substrate in the second space and the fourth space;
a conductive layer located in the first space, the second space, the third space and the fourth space in each segment space, wherein, in the first space, at least part of the conductive layer is adjacent to a side of the insulating layer away from the semiconductor substrate, and at least another part of the conductive layer is adjacent to the side of the first doped semiconductor layer away from the semiconductor substrate; in the second space to the fourth space, at least part of the conductive layer is adjacent to a side of the second doped semiconductor layer away from the semiconductor substrate;
at least one isolation groove located in each segment space, the at least one isolation groove being located only in the first space or simultaneously located in the second space and the fourth space, and the at least one isolation groove at least separates the conductive layer,
wherein from the first segment, the second segment, the third segment and the fourth segment to the front surface of the semiconductor substrate, there is a first distance L1, a second distance L2, a third distance L3 and a fourth distance L4 respectively, and the first distance L1, the second distance L2, the third distance L3 and the fourth distance L4 are measured from the back surface of the semiconductor substrate to the front surface of the semiconductor substrate, wherein,
L3 is less than or equal to L2;
L3 is less than or equal to L4;
L2 is less than or equal to L1; and
L4 is less than or equal to L1.

2. The back contact cell according to claim 1, wherein the semiconductor substrate further includes a substrate doped layer adjacent to each first segment, the substrate doped layer having the same conductivity type as the semiconductor substrate.

3. The back contact cell according to claim 1, comprising a doped oxide layer located in the first space in each segment space, and adjacently located between the side of the first doped semiconductor layer away from the semiconductor substrate and the insulating layer.

4. The back contact cell according to claim 1, comprising a first electrode and a second electrode, respectively located in the first space and the third space in each segment space, and the first electrode is located in the first space adjacent to a side of the conductive layer away from the semiconductor substrate, the second electrode is located in the third space adjacent to a side of the conductive layer away from the semiconductor substrate.

5. The back contact cell according to claim 4, wherein the conductive layer forms a contact groove concave toward the semiconductor substrate in the first space in each segment space, the first electrode contacts the conductive layer in the contact groove, and the contact groove contacts the conductive layer on a surface close to side of the semiconductor substrate, or extends into an interior of the first doped semiconductor layer.

6. The back contact cell according to claim 1, wherein cell structure in the second space corresponding to the second segment and the fourth space corresponding to the fourth segment are the same, and L2 is equal to L4.

7. The back contact cell according to claim 1, comprising a front-side passivation layer located between the front surface of the semiconductor substrate and the light-receiving surface and adjacent to the front surface, wherein the front-side passivation layer includes intrinsic amorphous silicon, aluminum oxide, silicon nitride, silicon oxynitride and/or silicon oxide.

8. The back contact cell according to claim 7, comprising a front-side anti-reflection layer adjacently located to a side of the front-side passivation layer away from the semiconductor substrate, wherein the front-side anti-reflection layer includes silicon nitride, silicon oxynitride, silicon oxide and/or transparent conductive layer.

9. The back contact cell according to claim 8, wherein the front surface of the semiconductor substrate has a textured structure, and the textured structure includes a pyramid textured surface and/or an etched pit textured surface.

10. The back contact cell according to claim 9, wherein the third segment is the textured surface structure or a polished surface structure, and the first segment, the second segment and the fourth segment are the polished surface structure.

11. The back contact cell according to claim 1, wherein the first passivation layer includes a tunnel oxide layer, the first doped semiconductor layer includes doped polysilicon, and the first doped semiconductor layer has the same doped type as the semiconductor substrate.

12. The back contact cell according to claim 11, wherein the second passivation layer includes intrinsic amorphous silicon, the second doped semiconductor layer includes doped amorphous silicon and/or microcrystalline silicon, and the second doped semiconductor layer is of an opposite doped type to the semiconductor substrate.

13. The back contact cell according to claim 3, comprising two isolation grooves, wherein the two isolation grooves include the at least one isolation groove, and wherein the two isolation grooves are located in the second space and the fourth space in each segment space, and the two isolation grooves penetrate at most to an interior of the insulating layer in a direction gradually approaching the semiconductor substrate.

14. The back contact cell according to claim 5, comprising two isolation grooves, wherein the two isolation grooves include the at least one isolation groove, and wherein the two isolation grooves are located in the first space in each segment space, and the two isolation grooves are respectively located on both sides of the contact groove, the two isolation grooves penetrate at most to an interior of the insulating layer in a direction gradually approaching the semiconductor substrate.

15. A solar cell module comprising a plurality of back contact cells according to claim 1 connected in series and/or in parallel.

* * * * *